(12) United States Patent
Keeth

(10) Patent No.: US 11,791,317 B2
(45) Date of Patent: *Oct. 17, 2023

(54) FINER GRAIN DYNAMIC RANDOM ACCESS MEMORY

(71) Applicant: Micron Technology, Inc., Boise, ID (US)

(72) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/048,732

(22) Filed: Oct. 21, 2022

(65) Prior Publication Data

US 2023/0063029 A1    Mar. 2, 2023

Related U.S. Application Data

(63) Continuation of application No. 15/976,580, filed on May 10, 2018, now Pat. No. 11,527,510.

(Continued)

(51) Int. Cl.
*H01L 25/065* (2023.01)
*H01L 27/02* (2006.01)
(Continued)

(52) U.S. Cl.
CPC ...... *H01L 25/0657* (2013.01); *H01L 27/0207* (2013.01); *H01L 24/16* (2013.01); *H01L 2027/11838* (2013.01); *H01L 2224/05548* (2013.01); *H01L 2224/13025* (2013.01); *H01L 2224/16145* (2013.01);

(Continued)

(58) Field of Classification Search
None
See application file for complete search history.

(56) References Cited

U.S. PATENT DOCUMENTS

| | | | |
|---|---|---|---|
| 8,537,634 B2 * | 9/2013 | Muralimanohar | H01L 25/0657 365/230.01 |
| 9,111,588 B2 * | 8/2015 | Vogelsang | G11C 5/06 |

(Continued)

FOREIGN PATENT DOCUMENTS

| | | |
|---|---|---|
| CN | 101836257 A | 9/2010 |
| CN | 102177549 A | 9/2011 |
| CN | 105229619 A | 1/2016 |

OTHER PUBLICATIONS

Chatterjee et al., "Architecting an Energy-Efficient DRAM System for GPUs," 12 pgs.

(Continued)

*Primary Examiner* — Nishath Yasmeen
(74) *Attorney, Agent, or Firm* — Holland & Hart LLP

(57) ABSTRACT

Systems, apparatuses, and methods related to dynamic random access memory (DRAM), such as finer grain DRAM, are described. For example, an array of memory cells in a memory device may be partitioned into regions. Each region may include a plurality of banks of memory cells. Each region may be associated with a data channel configured to communicate with a host device. In some examples, each channel of the array may include two or more data pins. The ratio of data pins per channel may be two or four in various examples. Other examples may include eight data pins per channel.

20 Claims, 9 Drawing Sheets

Related U.S. Application Data

(60) Provisional application No. 62/521,044, filed on Jun. 16, 2017.

(51) Int. Cl.
*H01L 23/00* (2006.01)
*H01L 27/118* (2006.01)

(52) U.S. Cl.
CPC ............... *H01L 2224/16146* (2013.01); *H01L 2224/16147* (2013.01); *H01L 2224/17106* (2013.01); *H01L 2224/17181* (2013.01); *H01L 2225/06513* (2013.01); *H01L 2225/06527* (2013.01); *H01L 2225/06541* (2013.01); *H01L 2225/06565* (2013.01); *H01L 2924/1436* (2013.01); *H01L 2924/1441* (2013.01)

(56) References Cited

U.S. PATENT DOCUMENTS

| | | | | |
|---|---|---|---|---|
| 9,236,295 | B2* | 1/2016 | Yoon | H01L 21/76877 |
| 2002/0133666 | A1* | 9/2002 | Janzen | G11C 7/1072 |
| | | | | 711/170 |
| 2007/0050530 | A1* | 3/2007 | Rajan | G11C 7/10 |
| | | | | 711/105 |
| 2008/0144346 | A1* | 6/2008 | Dono | G11C 5/06 |
| | | | | 365/51 |
| 2009/0103345 | A1* | 4/2009 | McLaren | G11C 5/02 |
| | | | | 365/64 |
| 2009/0161401 | A1* | 6/2009 | Bilger | G11C 13/0023 |
| | | | | 365/230.03 |
| 2009/0321893 | A1* | 12/2009 | Somasekhar | G11C 5/02 |
| | | | | 257/621 |
| 2009/0322748 | A1* | 12/2009 | Chen | G06T 7/11 |
| | | | | 345/424 |
| 2010/0020583 | A1* | 1/2010 | Kang | G11C 29/14 |
| | | | | 365/51 |
| 2010/0091536 | A1 | 4/2010 | Kim | |
| 2010/0091538 | A1 | 4/2010 | Kim et al. | |
| 2010/0121994 | A1 | 5/2010 | Kim et al. | |
| 2010/0135056 | A1 | 6/2010 | Hotta | |
| 2011/0161583 | A1* | 6/2011 | Youn | G11C 7/02 |
| | | | | 711/E12.001 |
| 2011/0193086 | A1 | 8/2011 | Lee et al. | |
| 2013/0001649 | A1* | 1/2013 | Shimizu | H01L 27/0207 |
| | | | | 257/E27.06 |
| 2014/0133259 | A1 | 5/2014 | Perego | |
| 2014/0192606 | A1* | 7/2014 | Kang | G11C 5/025 |
| | | | | 365/222 |
| 2015/0067274 | A1 | 3/2015 | Lee | |
| 2015/0146816 | A1 | 5/2015 | Hollis | |
| 2015/0270250 | A1 | 9/2015 | Takamitsu | |
| 2016/0124873 | A1 | 5/2016 | Xu et al. | |
| 2016/0155515 | A1 | 6/2016 | Son et al. | |

OTHER PUBLICATIONS

European Search Report and Search Opinion received for EP Application No. 18818644.9, dated Dec. 8, 2020, 7 pages.
International Search Report and Written Opinion received for PCT Patent Application No. PCT/US18/33317, dated Sep. 21, 2018, 11 pages.
Korean Patent Office, "Request for the Submission of an Opinion", issued in connection with Korean Patent Application No. 10-2021-7028680 dated Dec. 24, 2021 (12 pages).
Korean Patent Office, "Notice of Allowance," issued in connection with Korean Patent Application No. 10-2021-7028680 dated Jun. 27, 2022 (4 pages).
O'Connor et al., "Fine-Grained DRAM: Energy Efficient DRAM for Extreme Bandwidth Systems," 12pgs. Submission to International Symposium on Computer Architecture.
Poulton, et al., "A 0.54 pJ/b 20 GB/s Ground-Referenced Single-Ended Short-Reach Serial Link in 28 nm CMOS for Advanced Packaging Applications," IEEE Journal of Solid-State Circuits, vol. 48, No. 12, Dec. 2013, 13pgs.
Taiwan Intellectual Property Office, "Office Action," issued in connection with ROC (Taiwan) Patent Application No. 107119752, dated Dec. 23, 2020 (5 pages).
Chinese Patent Office, "Office Action," issued in connection with Chinese Patent Application No. 201880045249.0 dated Mar. 8, 2023 (18 pages total) (10 pages Original & 8 pages English Translation).

\* cited by examiner

FINER GRAIN DYNAMIC RANDOM ACCESS MEMORY

CROSS REFERENCE

The present Application for Patent is a continuation of U.S. patent application Ser. No. 15/976,580 by Keeth, entitled "Finer Grain Dynamic Random Access Memory," filed May 10, 2018 which claims the benefit of and priority to U.S. Provisional Patent Application No. 62/521,044 by Keeth, entitled "Finer Grain Dynamic Random Access Memory," filed Jun. 16, 2017; each of which assigned to the assignee hereof, and each of which is expressly incorporated by reference in its entirety herein.

BACKGROUND

The following relates generally to operating a memory array and more specifically to finer grain dynamic random access memory (DRAM).

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), DRAM, synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile.

Improving memory devices, generally, may include increasing memory cell density, increasing read/write speeds, increasing reliability, increasing data retention, reducing power consumption, or reducing manufacturing costs, among other metrics. Advancing memory technology has realized improvements for many of these metrics, but high reliability, low latency, and/or low-power devices tend to be expensive and may be difficult to scale. As the quantity of applications for high reliability, low latency, low-power memory increases, so too does the need for scalable, efficient, and cost-effective devices for such applications.

DETAILED DESCRIPTION

Some memory devices may include relatively long conductive paths between various components. Driving signals over long conductive paths may consume more power than driving signals over shorter paths and may lead to additional challenges and inefficiencies. Some memory technologies may include a plurality of channel terminals disbursed throughout a die area. Disbursing channel terminals throughout a die area may shorten a conductive path between the host device and a memory cell and may reduce the amount of power to access the memory cell. For example, some channel terminals may be positioned in an input/output (I/O) area (e.g., of the memory cell).

An array of memory cells in a memory device may be partitioned into a quantity of regions. Each region may include a plurality of banks of memory cells. Each region may be communicatively coupled to a host device using a channel that may include a quantity of data pins, a quantity of command/address pins, and a quantity of clock pins. The regions may be configured to minimize the distance between memory cells of the region and an interface with a host device. By minimizing or at least reducing a length of the signal path between the interface and the memory cells in the region, the memory device may be configured to achieve a high throughput of data (e.g., multiple TB/s) within an energy budget (e.g., less than three picofarads (pF) per access operation). In some memory devices, the memory die may have a centralized interface or ball-out for the memory cells. In such memory devices, the length of the signal paths between the interface and the memory cells may be longer.

Features of the disclosure introduced above are further described below in the context of an exemplary array (e.g., FIG. 1). Specific examples are then described for various examples or aspects of systems (e.g., FIGS. 2 and 9) and memory devices (FIGS. 3-8).

Figure 1:
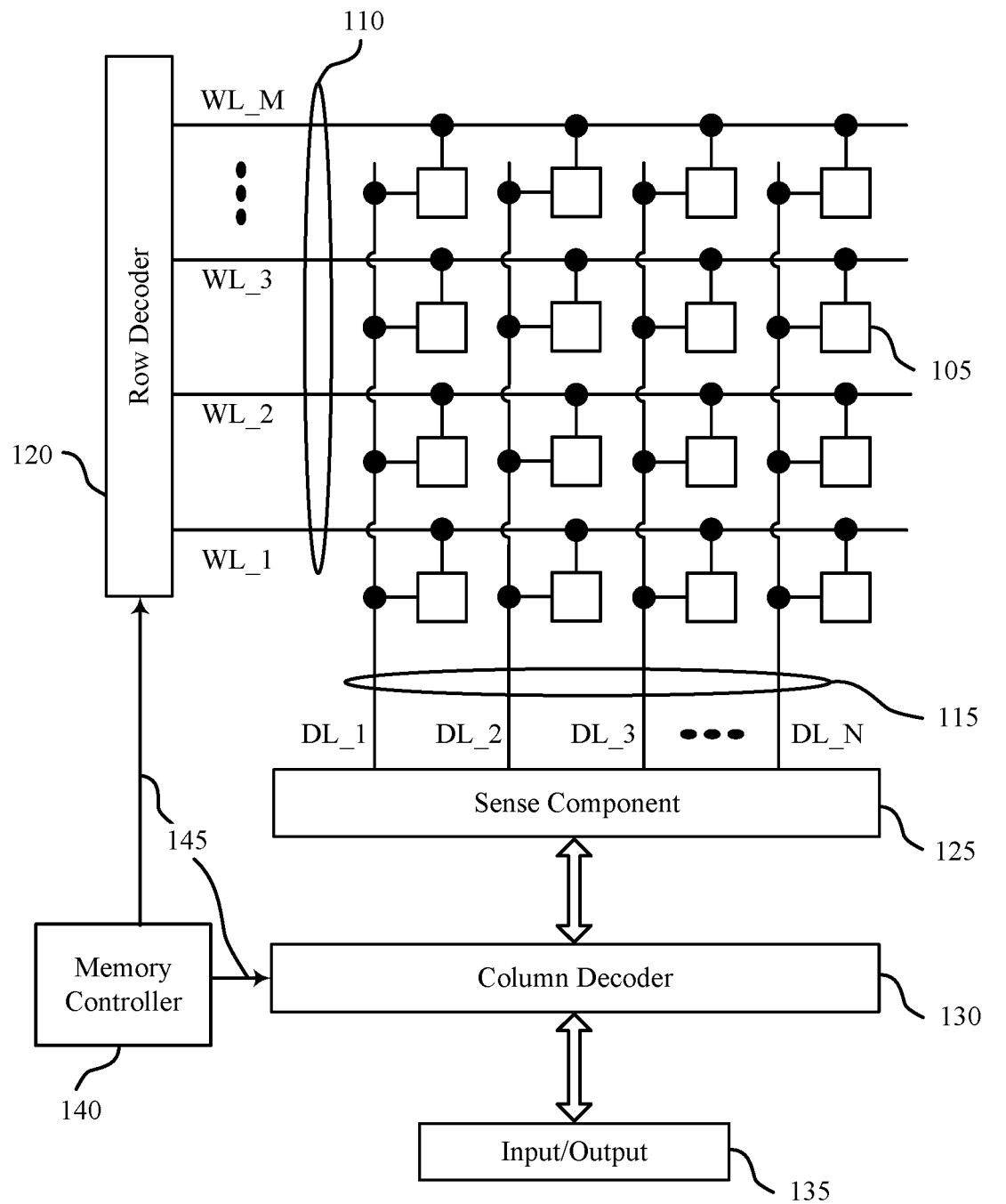
FIG. 1 illustrates an example of a memory die that supports features and operations in accordance with examples of the present disclosure.

FIG. 1 illustrates an example of the memory die 100 in accordance with various aspects disclosed herein. Memory die 100 may also be referred to as an electronic memory apparatus, a memory array, an array of memory cells, or a deck of memory cells, in some examples. The memory die 100 may include memory cells 105 that are programmable to store different states. Memory cells 105 may be arranged in one or more banks of memory cells that may be independently accessible. Each memory cell 105 may be programmable to store two states, denoted as a logic 0 and a logic 1. In some cases, memory cell 105 may be configured to store more than two logic states.

A memory cell 105 may store a charge representative of the programmable states in a capacitor; for example, a charged and uncharged capacitor may represent two logic states, respectively. DRAM architectures may use such a design, and the capacitor employed may include a dielectric material with linear or para-electric electric polarization properties as the insulator. FeRAM architectures may also employ such a design.

Operations such as reading and writing may be performed on memory cells 105 by activating access line 110 and digit line 115. Access lines 110 may also be known as word lines 110, and bit lines 115 may also be known digit lines 115. References to word lines and bit lines, or their analogues, are interchangeable without loss of understanding or operation. Activating a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 may be connected to a single word line 110, and each column of memory cells 105 may be connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. Additionally or alternatively, for example, each row of memory cells 105 may be arranged in one or more banks of memory cells.

In some architectures, the logic storing device of a cell, e.g., a capacitor, may be electrically isolated from the digit line by a selection component (not shown). The word line 110 may be connected to and may control the selection component. For example, the selection component may be a transistor and the word line 110 may be connected to the gate of the transistor. Activating the word line 110 may result in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. Row decoder 120 and column decoder 130 may receive a row address and a column address, respectively, for a memory cell located within one specific bank of memory cells. Additionally or alternatively, each bank of memory cells may be in electronic communication with a separate row decoder 120 and column decoder 130. For example, memory die 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing a memory cell 105, the cell may be read, or sensed, by sense component 125 to determine the stored state of the memory cell 105. For example, after accessing the memory cell 105, the capacitor of memory cell 105 may discharge onto its corresponding digit line 115. Discharging the capacitor may in some cases result from biasing, or applying a voltage, to the capacitor. The discharging may cause a change in the voltage of the digit line 115, which sense component 125 may compare to a reference voltage (not shown) to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—e.g., a logic value may be stored in the memory cell 105. Column decoder 130 or row decoder 120 may accept data, for example input/output 135, to be written to the memory cells 105. A memory cell 105 may be written by applying a voltage across the capacitor.

The memory controller 140 may control the operation (e.g., read, write, re-write, refresh, discharge, etc.) of memory cells 105 through the various components, for example, row decoder 120, column decoder 130, and sense component 125. Memory controller 140 may be a component of memory die 100 or may be external to memory die 100 in various examples. In some cases, one or more of the row decoder 120, column decoder 130, and sense component 125 may be co-located with the memory controller 140. Memory controller 140 may generate row and column address signals to activate the desired word line 110 and digit line 115. The memory controller 140 may activate the desired word line 110 and digit line 115 of a specific bank of memory cells via at least one channel traversing the memory die 100. Memory controller 140 may also generate and control various voltages or currents used during the operation of memory die 100. For example, it may apply discharge voltages to a word line 110 or digit line 115 after accessing one or more memory cells 105. Memory controller 140 may be coupled to memory cells 105 via channels 145. Channels 145 are illustrated in FIG. 1 as logical connections with row decoder 120 and column decoder 130, but those skilled in the art will recognize that other configurations may be employed. As described herein, memory controller 140 may exchange data (e.g., from a read or write operation) with cells 105 multiple times per clock cycle.

The memory controller 140 may also be configured to communicate commands, data, and other information with a host device (not shown). The memory controller 140 may use a modulation scheme to modulate signals communicated between the memory array and the host device. An I/O interface may be configured based on what type of modulation scheme is selected.

In general, the amplitude, shape, or duration of an applied voltage or current discussed herein may be adjusted or varied and may be different for the various operations discussed in operating the memory die 100. Furthermore, one, multiple, or all memory cells 105 within memory die 100 may be accessed simultaneously or concurrently; for example, multiple or all cells of memory die 100 may be accessed simultaneously or concurrently during a reset operation in which all memory cells 105, or a group of memory cells 105, are set to a single logic state.

Figure 2:
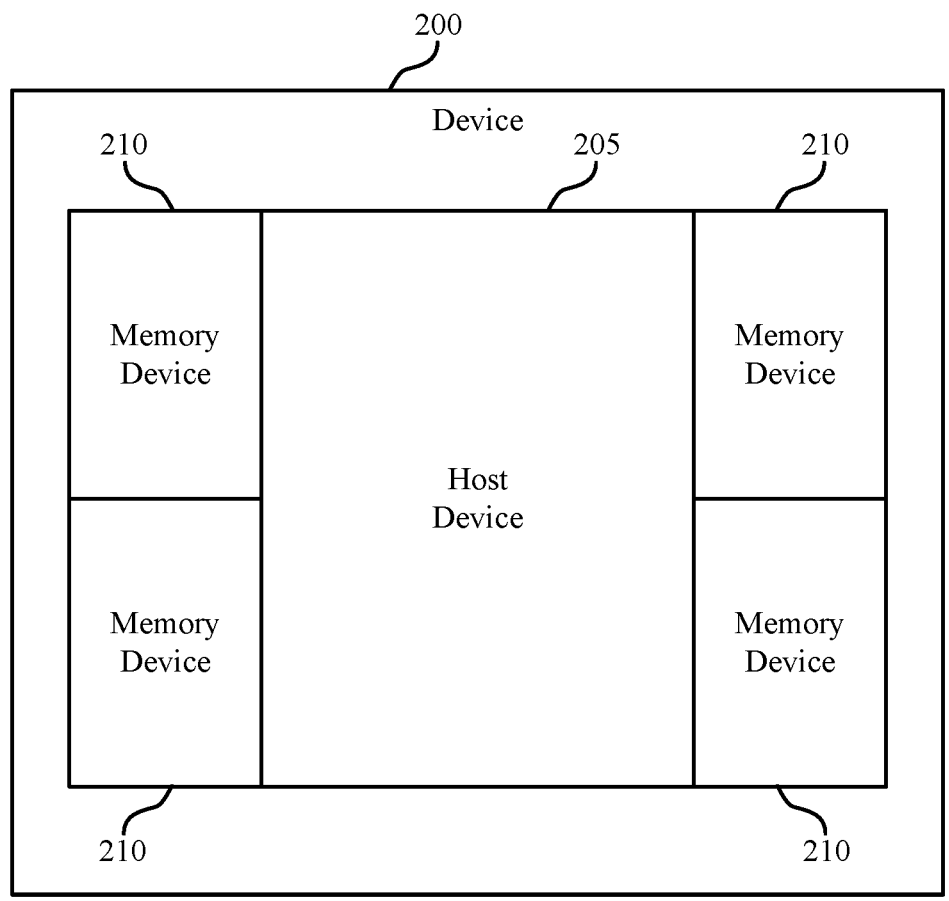
FIG. 2 illustrates an example of a device that supports features and operations in accordance with examples of the present disclosure.

FIG. 2 illustrates an apparatus or system 200 that supports channel routing for a memory device in accordance with various examples disclosed herein. The system 200 may include a host device 205 and a plurality of memory devices 210. The plurality of memory device 210 may be examples of a finer grain memory device (e.g., finer grain DRAM or finer grain FeRAM).

The host device 205 may be an example of a processor (e.g., a central processing unit (CPU), a graphics processing unit (GPU)), or a system on a chip (SoC). In some cases, the host device 205 may be a separate component from the memory device such that the host device 205 may be manufactured separately from the memory device. The host device 205 may be external to the memory device 210 (e.g., a laptop, server, personal computing device, smartphone, personal computer). In the system 200, the memory devices 210 may be configured to store data for the host device 205.

The host device 205 may exchange information with the memory devices 210 using signals communicated over signal paths. A signal path may be a path that a message or transmission may take from a transmitting component to a receiving component. In some cases, a signal path may be a conductor coupled with at least two components, where the conductor may selectively allow electrons to flow between the at least two components. The signal path may be formed in a wireless medium as in the case for wireless communications (e.g., radio frequency (RF) or optical). The signal paths may at least partially include a first substrate, such as an organic substrate of the memory device, and/or a second substrate, such as a package substrate (e.g., a second organic substrate) that may be coupled with at least one, if not both, of the memory device 210 and the host device 205. In some cases, the memory device 210 may function as a slave-type device to the host device 205, which may function as a master-type device.

In some applications, the system 200 may benefit from a high-speed connection between the host device 205 and the memory devices 210. As such, some memory devices 210 support applications, processes, host devices, or processors that have multiple terabytes per second (TB/s) bandwidth needs. Satisfying such a bandwidth constraint within an acceptable energy budget may pose challenges in certain contexts.

The memory devices 210 may be configured such that the signal path between the memory cells in the memory devices 210 and the host device 205 are as short as the material properties, operating environment, component layout, and application allow. For example, the memory devices 210 may be bufferless memory devices with a point-to-point connection between the host device and the memory array. In other examples, the data channels coupling a memory device 210 with the host device 205 may comprise a point-to-many-point configuration, with one pin of the host device 205 coupled with corresponding pins of at least two memory arrays. In another example, the data channels coupling a memory device 210 with the host device 205 may be configured to be shorter than other designs, such as other near-memory applications (e.g., a graphics card employing GDDR5-compliant DRAM).

The memory dies of the memory devices 210 may be configured to work with multiple types of communication mediums (e.g., substrates such as organic substrates and/or high-density interposers such as silicon interposers). The host device 205 may, in some cases, be configured with an interface or ball-out comprising a design (e.g., a matrix or pattern) of terminals.

Figure 3:
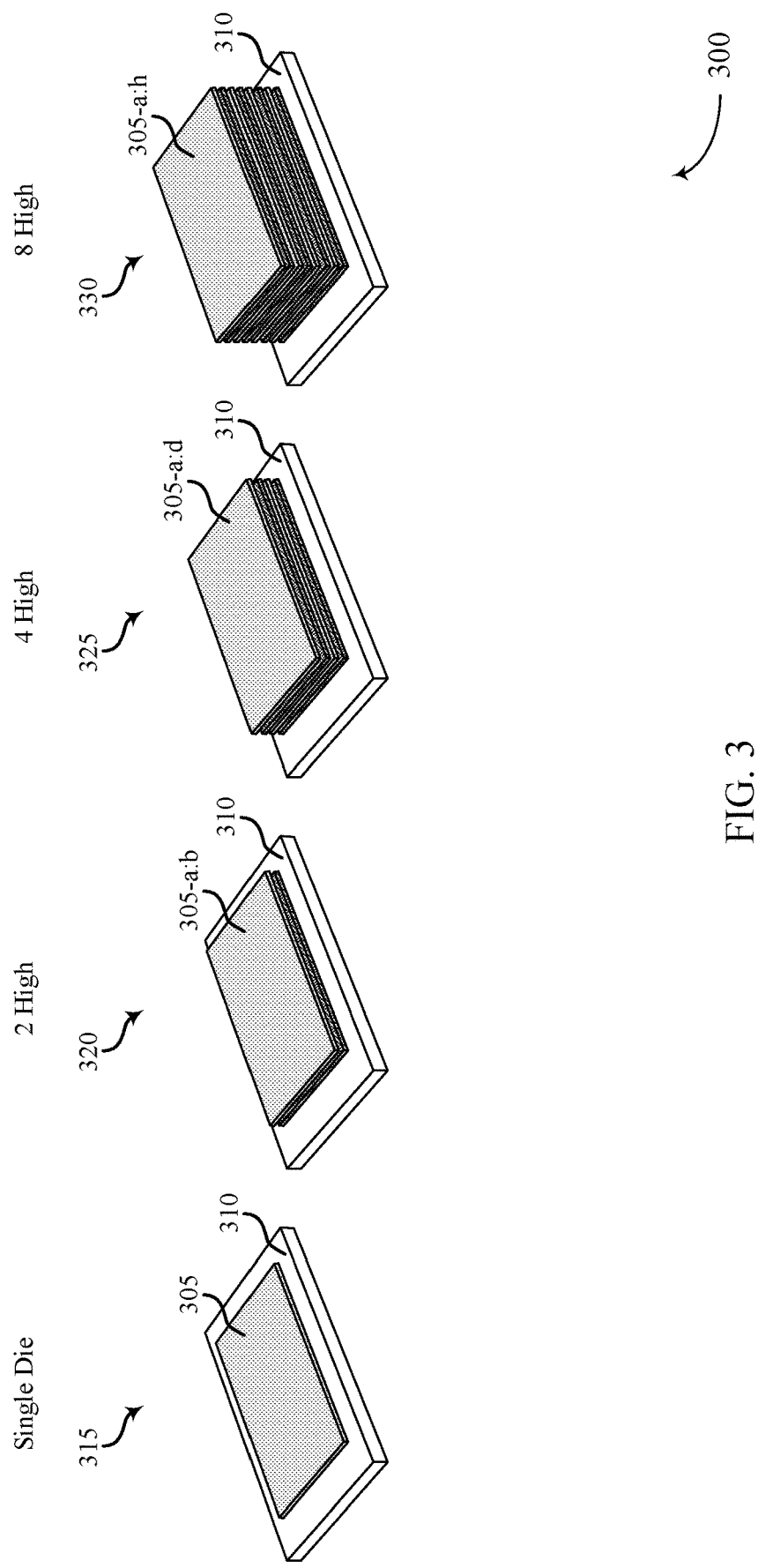
FIG. 3 illustrates an example of a memory die that supports features and operations in accordance with examples of the present disclosure.

FIG. 3 illustrates an example of a device or devices 300 in accordance with various examples disclosed herein. The memory devices 300 include at least one memory die 305 and a communication medium 310. The communication medium 310 may, in some cases, be an example of a substrate.

The memory die 305 may include a plurality of memory cells (as shown in and described with reference to FIG. 1) that may be programmable to store different logic states. For example, each memory cell may be programmed to store one or more logic states (e.g., a logic '0', a logic '1', a logic '00', a logic '01', a logic '10', a logic '11'). The memory cells of the memory dies 305 may use different storage technologies to store data including DRAM, FeRAM, phase change memory (PCM), 3D XPoint™ memory, NAND memory, or NOR memory, or a combination thereof. In some cases, a single memory device may include a first memory die that uses a first memory technology (e.g., DRAM) and a second memory die that uses second memory technology (e.g., FeRAM) different from the first memory technology.

The memory dies 305 may be an example of two-dimensional (2D) array of memory cells. In some cases, multiple memory dies 305 may be stacked on top of one another to form a three-dimensional (3D) array. A memory die may include multiple decks of memory cells stacked on top of one another. Such a configuration may increase the quantity of memory cells that may be formed on a single die or substrate as compared with 2D arrays. In turn, this may reduce production costs, or increase the performance of the memory array, or both. Each level of the array may be positioned so that memory cells across each level may be approximately aligned with one another, forming a memory cell stack. In some cases, the memory dies 305 may be stacked directly on one another. In other cases, one or more of the memory dies 305 may be positioned away from a stack of memory dies (e.g., in different memory stacks).

A first memory device 315 may be an example of a single die package that includes a single memory die 305 and a communication medium 310. A second memory device 320 may be an example of a two-high device that includes two memory dies 305-a and 305-b and a communication medium 310. A third memory device 325 may be an example of a four-high device that includes four memory dies 305-a through 305-d and a communication medium 310. A fourth memory device 330 may be an example of an eight-high device that includes eight memory dies 305-a through 305-h and a communication medium 310. A memory device 300 may include any quantity of memory dies 305, that may in some examples be stacked on top of a common substrate. The dies are shown as different shadings to more clearly demonstrate the different layers. In some cases, the memory dies in different layers may be configured similarly as adjacent dies in the memory device.

The memory dies 305 may include one or more vias (e.g., through-silicon vias (TSVs)). In some cases, the one or more vias may be part of internal signal paths that couple controllers with memory cells. The vias may be used to communicate between memory dies 305, for example, when the memory dies 100 are stacked on one another. Some vias may be used to facilitate communication between a controller of the memory device and at least some of the memory dies 305. In some cases, a single via may be coupled with multiple memory dies 305.

The communication medium 310 may be any structure or medium used to couple the memory dies 305 with a host device such that signals may be exchanged between the memory dies 305 and the host device. The communication medium 310 may be an example of a substrate, an organic substrate, a high-density interposer, a silicon interposer, or a combination thereof. The communication medium 310 may be positioned above, below, or to the side of a memory array. The communication medium 310 may not be limited to being underneath other components but may be in any configuration relative to the memory array and/or other components. In some instances, the communication medium 310 may be referred to as a substrate, however, such references are not limiting.

The communication medium 310 may be formed of different types of materials. In some cases, the communication medium 310 may be an example of one or more organic substrates. For example, the communication medium 310 may include a package substrate (e.g., an organic substrate) coupled with at least one if not both of the host device and the stack of memory dies 305. In another example, the communication medium 310 may include an organic substrate of the memory device and the package substrate. A substrate may be an example of a printed circuit board that mechanically supports and/or electrically connects components. The substrate may use conductive tracks, pads and other features etched from one or more layers of a conductive material (e.g., copper) laminated onto and/or between layers of a non-conductive material. Components may be fastened (e.g., soldered) onto the substrate to both electrically connect and mechanically fasten the components. In some cases, non-conductive materials of a substrate may be formed of a variety of different materials including phenolic paper or phenolic cotton paper impregnated with resin, fiberglass impregnated with resin, metal core board, polyimide foil, Kapton, UPILEX, polyimide-fluoropolymer composite foil, Ajinomoto build-up film (ABF), or other materials, or a combination thereof.

In some cases, the communication medium 310 may be a high-density interposer such as a silicon interposer. A high-density interposer may be configured to provide wide signal paths between connected components (e.g., a memory device and a host device). The high-density interposer may provide wide signal paths by offering a high quantity of channels to connect components. In some cases, the channels may be thin traces of connecter (e.g., copper), thereby making each individual channel lossy. Because each channel may be highly resistive, as the frequency of data transferred increases, the power needed to transfer the data may increase in a non-linear relationship with the frequency. Such characteristics may impose a practical frequency threshold (e.g., ceiling) that can be used to transmit data over a channel of the silicon interposer given an amount of transmit power. The channels may, in some cases, be independent of one another. Some channels may be unidirectional and some channels may be bidirectional.

In some cases, a buffer layer may be positioned between the memory dies 305 and the communication medium 310. The buffer may be configured to drive (e.g., redrive) signals to and from the memory dies 305. In some cases, the memory stack may be bufferless, meaning that either no buffer layer is present or that a base layer does not include redrivers, among other components.

Figure 4:
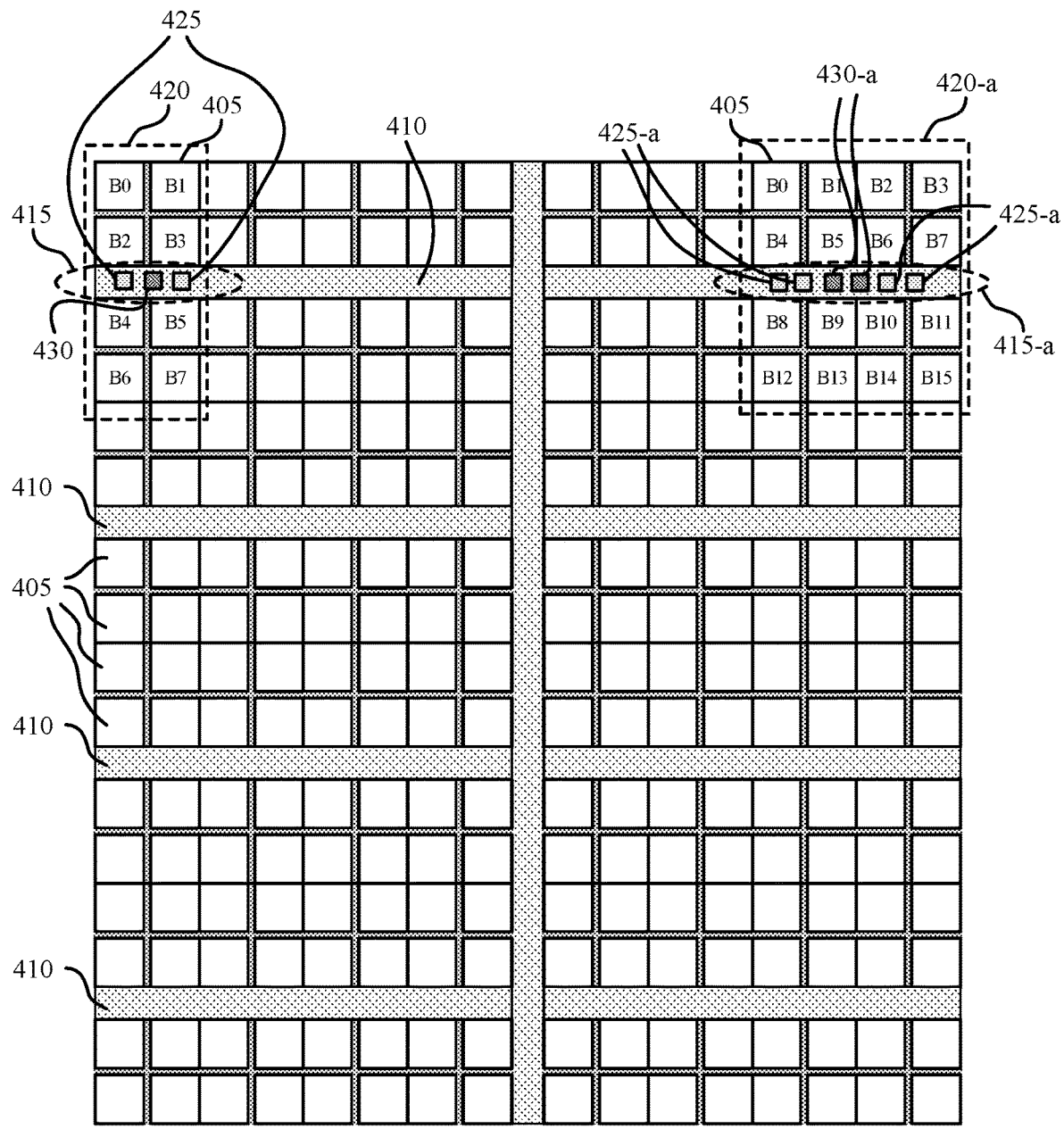
FIG. 4 illustrates an example of a memory die that supports features and operations in accordance with examples of the present disclosure.

FIG. 4 illustrates an example of a memory die 400 in accordance with various examples disclosed herein. The memory die 400 may be an example of a memory die 305 described with reference to FIG. 3. In some cases, the memory die 400 may be referred to as a memory array, an array of memory cells, or a deck of memory cells. The various components of the memory die 400 may be configured to facilitate high bandwidth data transfer between the host device and a memory device with which the memory die 400 is associated.

The memory die 400 may include a plurality of banks 405 of memory cells (as represented by the white boxes), a plurality of input/output (I/O) areas 410 (sometimes referred to as I/O stripes or I/O regions) traversing the memory cells of the memory die 400, and a plurality of data channels 415 that may couple the memory die 400 with the host device. Each of the banks 405 of memory cells may include a plurality of memory cells configured to store data. The memory cells may be DRAM memory cells, FeRAM memory cells, or other types of memory cells.

The memory die 400 may be divided into cell regions 420 associated with different data channels 415. For example, a single data channel 415 may be configured to couple a single cell region 420 with the host device. In some cases, the pins of the I/O channel may be configured to couple multiple cell regions 420 of the memory die 400 to power, ground, virtual ground, and/or other supporting components.

To provide a high throughput of data (e.g., multiple TB/s) between a host device (not shown) and the memory die 400, a path length between any given memory cell and the interface with the data channel 415 may be shorter compared to other previous solutions. In addition, shortening the data path between any given memory cell and the host device may reduce the power consumed during an access operation (e.g., read operation or write operation) of that given memory cell. Different architectures and/or strategies may be employed to reduce the size of the data path.

In some examples, the memory die 400 may be partitioned into a plurality of cell regions 420. Each cell region 420 may be associated with a data channel 415. Two different types of cell region 420 are illustrated, but the entire memory die 400 may be populated with any quantity of cell regions 420 having any shape. A cell region 420 may include a plurality of banks 405 of memory cells. There may be any quantity of banks 405 in a cell region 420. For example, the memory die 400 illustrates a first cell region 420 that may include eight banks 405 and a second cell region 420-a that may include sixteen banks 405-a.

Other quantities of banks in the cell region are possible, however (e.g., two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four, twenty-five, twenty-six, twenty-seven, twenty-eight, twenty-nine, thirty, thirty-one, thirty-two, etc.). The size of the cell region 420 may be selected based on the bandwidth constraints of the host device, the power needs of the host device or the memory device, the size of the data channel, a data rate associated with the data channel, other considerations, or any combination thereof. In some cases, the memory die 400 may be partitioned such that each cell region 420 may be the same size. In other cases, the memory die 400 may be partitioned such that the memory die 400 may have cell regions 420 of different sizes.

A data channel 415 (associated with a cell region) may include a quantity of pins for coupling the memory cells of the cell region 420 with the host device. At least a portion of the data channel 415 may comprise channels of the substrate (e.g., high-density interposer or organic substrate). The data channel 415 may include a data width specifying how many data pins 425 (sometimes referenced as DQ pins) are in the data channel 415. For example, a data channel may have a channel width of two data pins (e.g., X2 channel), four data pins (e.g., X4 channel), eight data pins (e.g., X8 channel), sixteen data pins (e.g., X16 channel), etc. The data channel may also include at least one command/address (C/A) pin 430. Each memory cell in the cell region 420 may be configured to transfer data to and from the host device using the pins 425, 430 associated with the cell region 420. The data channel 415 may also include a clock pin (e.g., CLK), and/or a read clock pin or a return clock pin (RCLK).

An I/O interface of the memory die 400 may be configured to support multiple channel widths (e.g., ×4, ×8, ×16, ×32, etc.). In some instances, to maintain data bandwidth, data throughput, or data accessibility, different modulation schemes may be used to communicate data across channels with different widths. For example, PAM4 may be used to modulate signals communicated across an X4 channel and NRZ may be used to modulate signals communicated across an X8 channel.

The plurality of I/O areas 410 may include a plurality of power pins and ground pins configured to couple the memory cells of the memory die 400 with power and ground. In some cases, the I/O areas 410 may include TSVs to communicate power signals and/or ground signals with memory dies that are positioned above or below the memory die 400.

The I/O areas 410 may include interfaces or terminals for the data channels 415. The interfaces or terminals may include a plurality of pins or pads that are configured to couple with signal paths. The signal paths may couple the memory cells of the region 420 with the channel 415. The I/O areas 410 may, in some cases, include TSVs to communicate signals (e.g., using the data channels 415) with memory dies that are positioned above or below the memory die 400.

The I/O areas 410 may, in some cases, bisect the banks 405 of memory cells in the cell region 420. In cases where the terminals for a channel are positioned in the I/O area 410, the length of the signal path for any individual memory cell in the region 420 may be shortened. The I/O areas 410 may be configured to bisect the regions 420. In some cases, the I/O areas 410 may split the banks 405 of the region 420 such that 50% of the banks 405 are on a first side of the I/O area 410 and 50% of the banks 405 are on a second side of the I/O area 410. In other examples, the I/O area 410 may bisect the region such that the split of banks 405 on either side of the I/O area 410 is unequal. In some cases, the regions 420 may be defined such that I/O area 410 bisects the region 420. The memory die 400 includes four I/O areas 410. In other examples, the memory die 400 may include other quantities of I/O areas (e.g., one, two, three, five, six, seven, eight, nine, ten, eleven, twelve, thirteen, fourteen, fifteen, sixteen, etc.).

Figure 5:
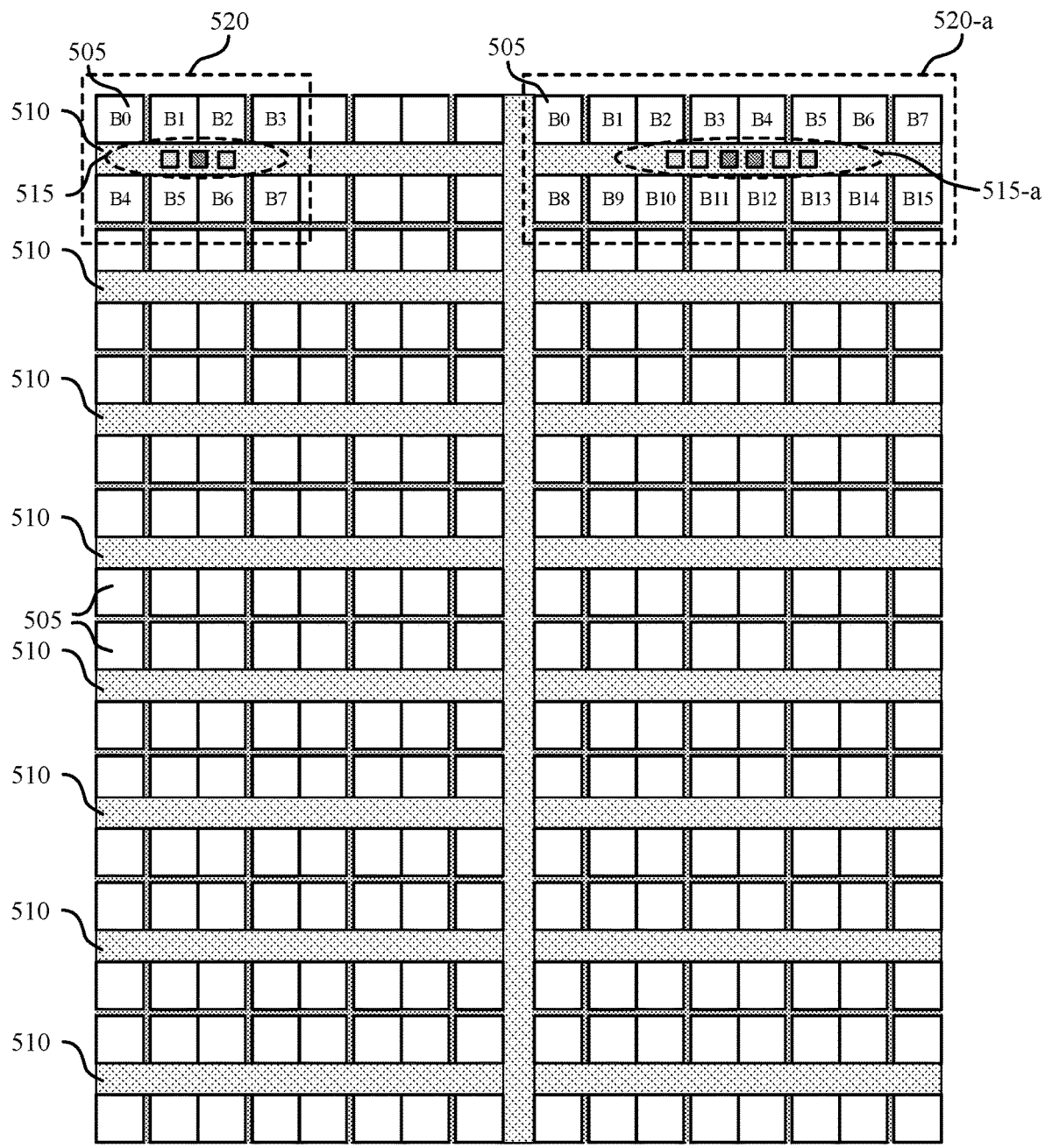
FIG. 5 illustrates an example of a memory die that supports features and operations in accordance with examples of the present disclosure.

FIG. 5 illustrates an example of a memory die 500 that includes eight I/O areas 510 bisecting the memory die 500. Using eight I/O areas 510 may alter some characteristics of the regions 520 as compared to the memory die 400. The memory die 500 may be an example of the memory die 400 and, as such, full descriptions of some features of the memory die 500 are not repeated here. Components with similar names and/or similar numbers may be embodied similarly.

In some cases, using eight I/O areas 510 may change the shape of the regions 520. The regions 520 may be configured to be bisected by an I/O area 510 (or the I/O areas 510 may be configured to bisect regions 520). In this manner, a length of signal paths that couples memory cells with channel terminals positioned in the I/O areas 510 may be minimized. As more I/O areas extend across the memory die, fewer banks 505 may be positioned between I/O areas. If a single channel services a region 520 of banks 505, the shape of the region 520 may be different than a shape of the region 420. For example, the regions 520 and 520-a may include a single bank 505 positioned on each side of the I/O area 510, where the regions 420 and 420-a may include two banks positioned on each side of the I/O area 410.

Figure 6:
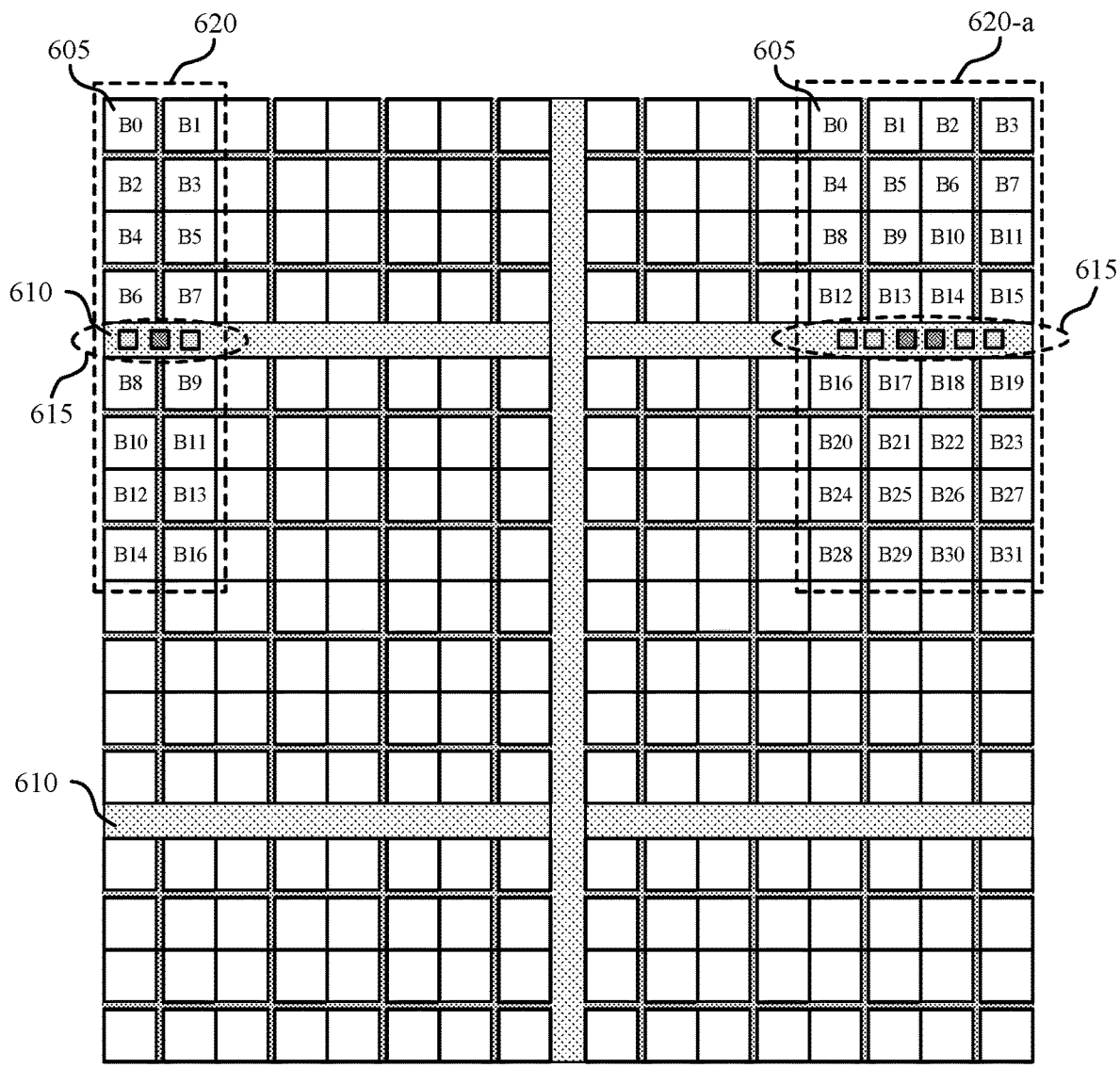
FIG. 6 illustrates an example of a memory die that supports features and operations in accordance with examples of the present disclosure.

FIG. 6 illustrates an example of a memory die 600 that includes two I/O areas 610 bisecting the memory die 600. Using two I/O areas 610 may alter some characteristics of the regions 620 as compared to the memory die 400. The memory die 600 may be an example of the memory die 400 and, as such, full descriptions of some features of the memory die 600 are not repeated here. Components with similar names and/or similar numbers may be embodied similarly.

In some cases, using two I/O areas 610 may change the shape of the regions 620. The regions 620 may be configured to be bisected by an I/O area 610 (or the I/O areas 610 may be configured to bisect regions 620). As fewer I/O areas extend across the memory die, more banks 605 may be positioned between I/O areas. If a single channel services a region 620 of banks 605, the shape of the region 620 may be different than a shape of the region 420. For example, the regions 620 and 620-a may include four banks 605 positioned on each side of the I/O area 610, where the regions 420 and 420-a may include two banks positioned on each side of the I/O area 410.

Figure 7:
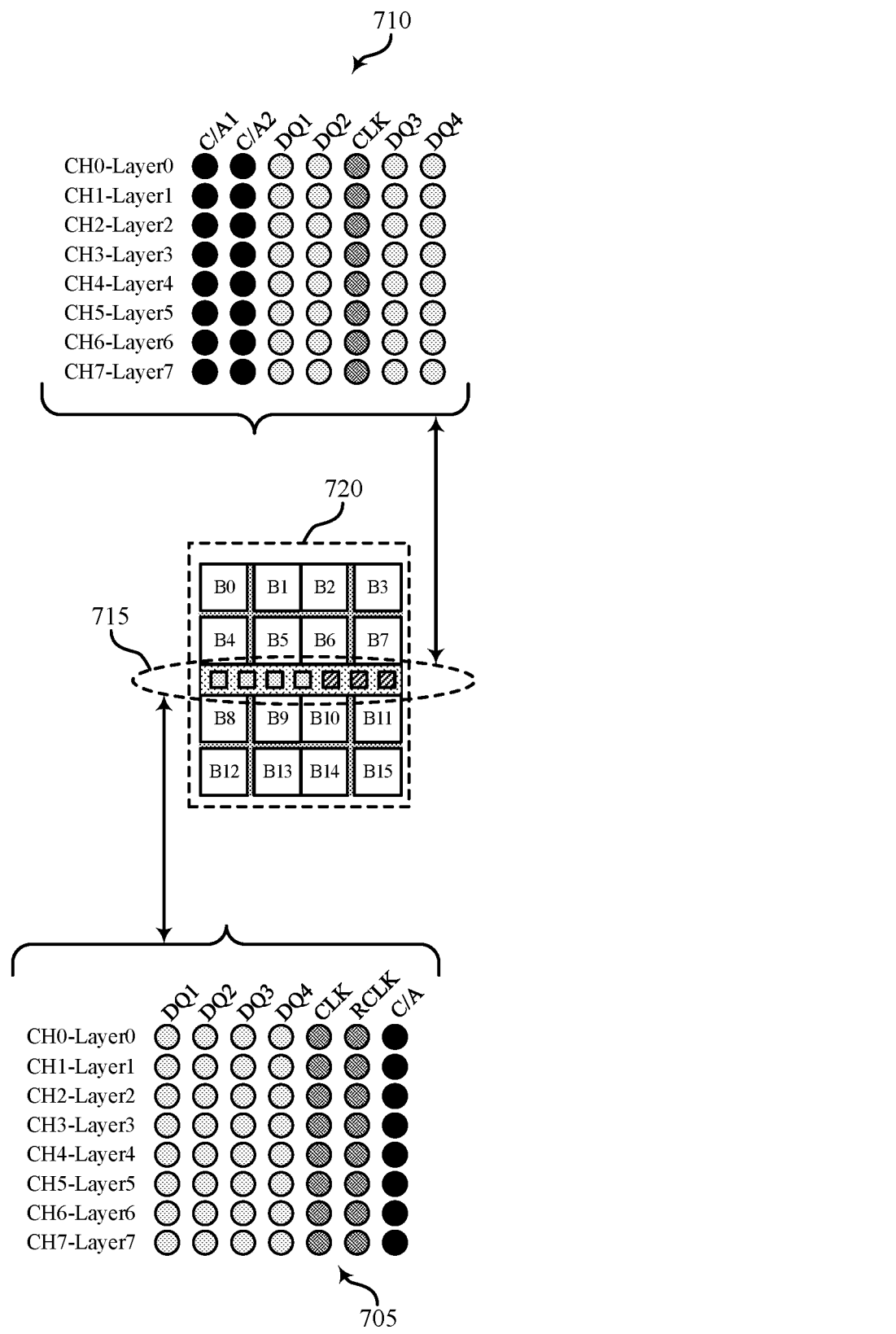
FIG. 7 illustrates examples of data channel configurations that support features and operations in accordance with examples of the present disclosure.

FIG. 7 illustrates an example of data channel configurations 700 in accordance with various examples disclosed herein. The data channel configurations 700 may include a first data channel configuration 705 and a second data channel configuration 710. For example, a first data channel configuration 705 illustrates a data channel 715 that services a cell region 720.

The data channel 715 illustrates a data channel for a stacked memory device that includes eight layers and that has a channel width of four (e.g., there are four data pins). Each row of pins in the data channel 715 may be associated with a cell region in a separate layer. The cell region 720 illustrates a cell region of a single layer. As such, the cell region 720 may be associated with a single row of the pins of the data channel 715. The quantity of pins in a data channel may be based on the quantity of layers in the memory device because a single data channel may be configured to couple with multiple layers.

In some examples, data channels may be coupled with a single cell region (e.g., without being coupled with another cell region) of any given layer or memory die. Although data channel 715 may be associated with cell regions in eight layers, any quantity of layers are possible. For example, the data channel 715 may be associated with cell regions in one, two, three, four, five, six, seven, eight, nine, ten, eleven, twelve, thirteen, fourteen, fifteen, or sixteen (or more) layers of the memory device.

The first configuration 705 of the data channel 715 may include four data pins (DQ0-DQ4), a clock pin (CLK), a read clock pin or return clock pin (RCLK), and a command/address pin (CA). In other cases, the data channel 715 may have a different rank or different channel width. In such situations, the quantity of data pins may be different. For example, the first configuration 705 of the data channel 715 may have a channel width of eight and may include eight data pins. Any quantity of data pins associated with a region are contemplated by this disclosure. The first configuration 705 of the data channel 715 may include any quantity of C/A pins. For example, the data channel 715 may include one, two, three, or four C/A pins. In some cases, the first configuration 705 of the data channel 715 may include an error correction code (ECC) pin for facilitating error detection and correction procedures.

The second configuration 710 of the data channel 715 may include four data pins (DQ0-DQ4), a clock pin (CLK), and two command/address pins (CA). In other cases, the data channel 715 may have a different rank or different channel width. In such situations, the quantity of data pins may be different. For example, the second configuration 710 of the data channel 715 may have a channel width of eight and may include eight data pins. Any quantity of data pins associated with a region are contemplated by this disclosure. The second configuration 710 of the data channel 715 may include any quantity of C/A pins. For example, the data channel 715 may include one, two, three, or four C/A pins. In some cases, the second configuration 710 of the data channel 715 may include an ECC pin for facilitating error detection and correction procedures.

Figure 8:
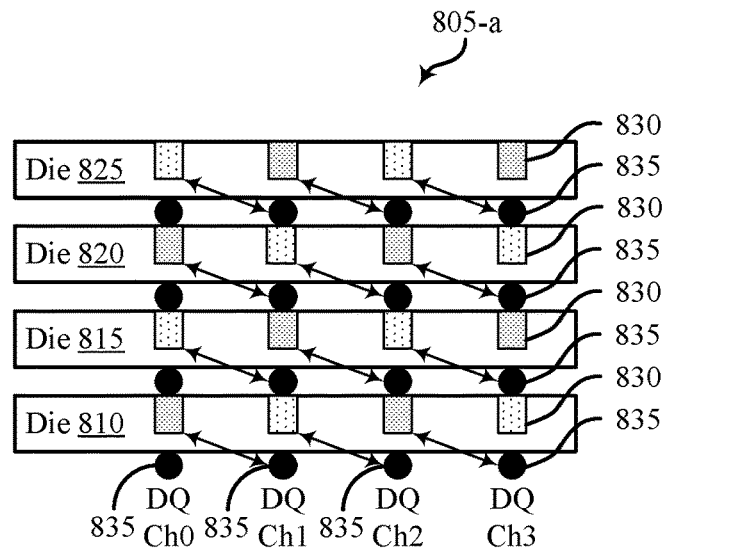
FIG. 8 illustrates examples of signal path routing that support features and operations in accordance with examples of the present disclosure.
Figure 8:
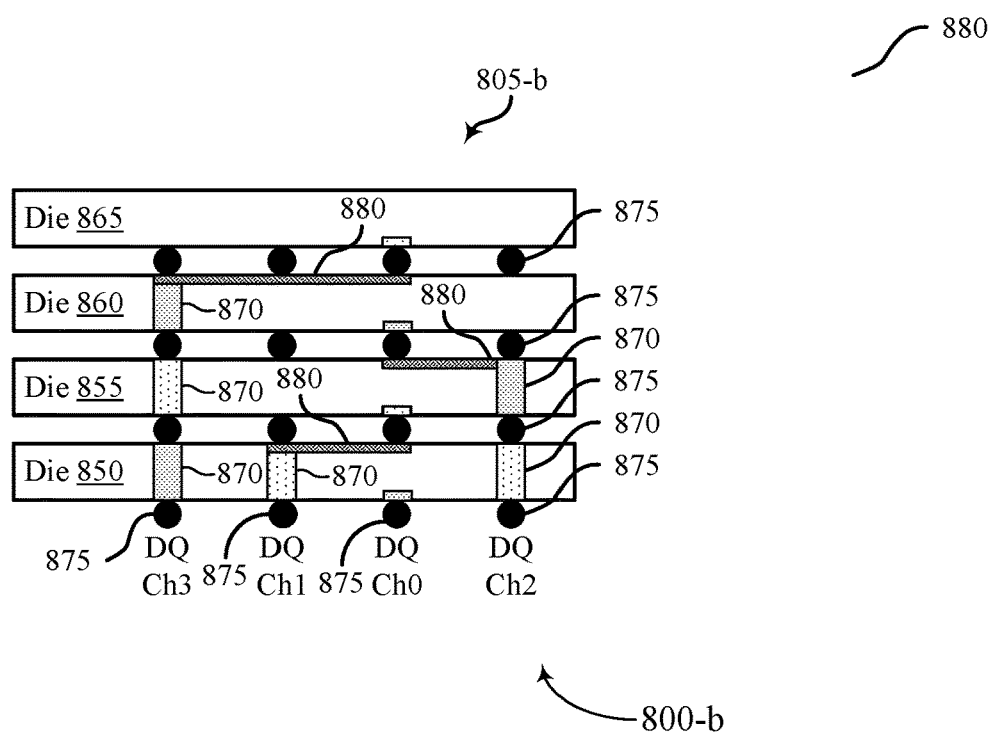

FIG. 8 illustrates examples of signal path routing 800 in a memory device 805. A first memory device 805-a includes a first signal path routing 800-a and a second memory device 805-b includes a second signal path routing 800-b. The examples of signal path routing show different options connecting TSVs between different dies of the memory device 805.

The first memory device 805-a may include a first memory die 810, a second memory die 815, a third memory die 820, and a fourth memory die 825. In other examples, the first memory device 805-a may include more or fewer memory dies than what is shown. A plurality of TSVs 830 may extend at least partially through each memory die 810, 815, 820, 825. Each die may include at least one pad 835 coupling the signal paths of the memory dies 810, 815, 820, 825 together. The stack of memory dies may include pads 835 at the bottom that couple with data channels (DQ Ch0, DQ Ch1, DQ Ch2, DQ Ch3).

In the first signal path routing 800-a, a TSV 830 may be coupled to a pad 835 of a neighboring column. For example, the TSV 830 in the DQ Ch0 column of the first memory die 810 may be communicatively coupled with the pad 835 that is under the first die 810 and in the DQ Ch1 column. In such a manner, the signal paths may include TSVs that are offset from one another in adjacent layers. In the first signal path routing 800-a, the memory device 805-a may not include signal paths that have TSVs that go up in the same column for more than one die at a time.

The second memory device 805-b may include a first memory die 850, a second memory die 855, a third memory die 860, and a fourth memory die 865. In other examples, the second memory device 805-b may include more or fewer memory dies than what is shown. A plurality of TSVs 870 extend at least partially through each die 850, 855, 860, 865. Each die includes at least one pad 875 coupling the signal paths of the dies 850, 855, 860, 865 together. The stack of memory dies may include pads 875 at the bottom that couple with data channels (DQ Ch0, DQ Ch1, DQ Ch2, DQ Ch3).

In the second signal path routing 800-b, each data channel terminates in the column associated with DQ Ch0. For example, the signal path for DQ Ch0 may be coupled with the first memory die 850 in the column associated with DQ Ch0. The signal path for DQ Ch1 may include a TSV 870 extending through the first memory die 850, a lateral conductive path 880, and couples with the second memory die 855 in the column associated with DQ Ch0. The signal path for DQ Ch2 may include TSVs 870 extending through the first memory die 850 and the second memory die 855, a lateral conductive path 880, and couples with the third memory die 860 in the column associated with DQ Ch0. The signal path for DQ Ch3 may include TSVs 870 extending through the first memory die 850, the second memory die 855, and the third memory die 860, a lateral conductive path 880, and couples with the fourth memory die 865 in the column associated with DQ Ch0.

Figure 9:
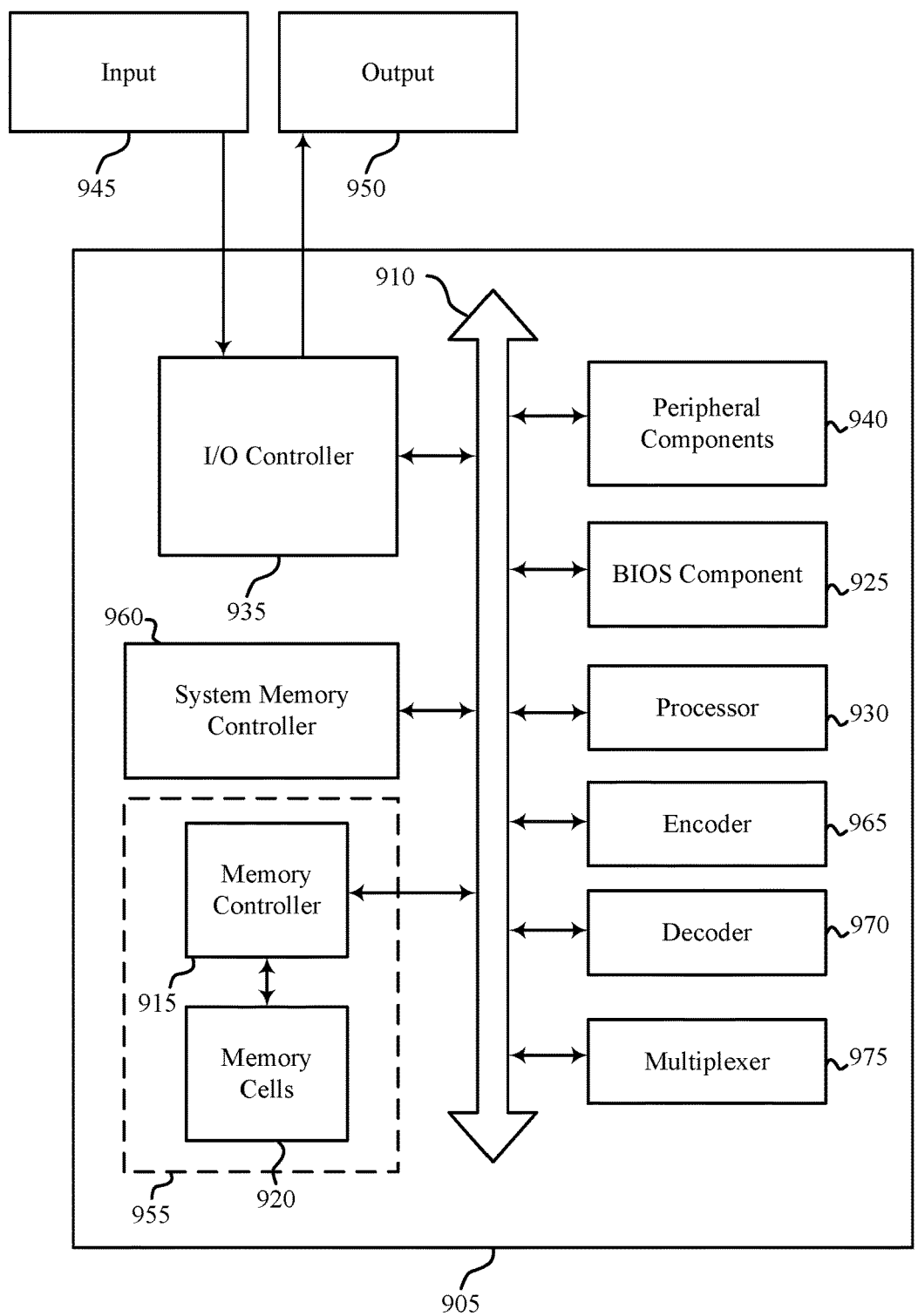
FIG. 9 illustrates an example of a system that supports features and operations in accordance with examples of the present disclosure.

FIG. 9 shows a diagram of a system 900 including a device 905 that supports finer grain DRAM in accordance with aspects disclosed herein. Device 905 may include components for bi-directional voice and data communications including components for transmitting and receiving communications, including memory controller 915, memory cells 920, basic input/output system (BIOS) component 925, processor 930, I/O controller 935, peripheral components 940, memory chip 955, system memory controller 960, encoder 965, decoder 970, and multiplexer 975. These components may be in electronic communication via one or more busses (e.g., bus 910). Bus 910, for example, may have a bus width of 16 data lines ("DQ" lines). Bus 910 may be in electronic communication with 32 banks of memory cells.

Memory controller 915 or 960 may operate one or more memory cells as described herein. Specifically, memory controller may be configured to support flexible multi-channel memory. In some cases, memory controller 915 or 960 may operate a row decoder, column decoder, or both, as described with reference to FIG. 1. Memory controller 915 or 960 may be in electronic communication with a host and may be configured to transfer data during each of a rising edge and a falling edge of a clock signal of the memory controller 915 or 960.

Memory cells 920 may store information (i.e., in the form of a logical state) as described herein. Memory cells 920 may represent, for example, memory cells 105 described with reference to FIG. 1. Memory cells 920 may be in electronic communication with memory controller 915 or 960, and memory cells 920 and memory controller 915 or 960 may be located on a chip 955, which may be one or several planar memory devices as described herein. Chip 955 may, for example, be managed by system memory controller 915 or 960. Memory cells 920 may represent a first array of memory cells with a plurality of regions coupled to a substrate. Each region of the plurality of regions may include a plurality of banks of memory cells and a plurality of channels traversing the first array of memory cells. At least one of the plurality of channels may be coupled to at least one region. Memory controller 915 or 960 may be configured to transfer data between the coupled region and the memory controller 915 or 960.

BIOS component 925 be a software component that includes BIOS operated as firmware, which may initialize and run various hardware components. BIOS component 925 may also manage data flow between a processor and various other components, e.g., peripheral components, input/output control component, etc. BIOS component 925 may include a program or software stored in read only memory (ROM), flash memory, or any other non-volatile memory.

Processor 930 may include an intelligent hardware device, (e.g., a general-purpose processor, a digital signal processor (DSP), a central processing unit (CPU), a micro-controller, an application-specific integrated circuit (ASIC), an field programmable gate array (FPGA), a programmable logic device, a discrete gate or transistor logic component, a discrete hardware component, or any combination thereof). In some cases, processor 930 may be configured to operate a memory array using a memory controller 915 or 960. In other cases, a memory controller 915 or 960 may be integrated into processor 930. Processor 930 may be configured to execute computer-readable instructions stored in a memory to perform various functions (e.g., functions or tasks supporting flexible multi-channel memory).

I/O controller 935 may manage input and output signals for device 905. I/O controller 935 may also manage peripherals not integrated into device 905. In some cases, I/O controller 935 may represent a physical connection or port to an external peripheral. I/O controller 935 may utilize an operating system such as iOS®, ANDROID®, MS-DOS®, MS-WINDOWS®, OS/2®, UNIX®, LINUX®, or another known operating system. In other cases, I/O controller 935 may represent or interact with a modem, a keyboard, a mouse, a touchscreen, or a similar device. In some cases, I/O controller 935 may be implemented as part of a processor. A user may interact with device 905 via I/O controller 935 or via hardware components controlled by I/O controller 935.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O controller 935, and may interact with device 905 via a peripheral component 940.

Output 950 may also represent a device or signal external to device 905 configured to receive output from device 905 or any of its components. Examples of output 950 may include a graphics display, audio speakers, a printing device, another processor or printed circuit board, etc. In some cases, output 950 may be a peripheral element that interfaces with device 905 via peripheral component(s) 940. Output 950 may be managed by I/O controller 935.

System memory controller 915 or 960 may be in electronic communication with a first array of memory cells (e.g., memory cells 920). A host may be a component or device that controls or directs operations for a device of which memory controller 915 or 960 and corresponding memory array are a part. A host may be a component of a computer, mobile device, or the like. Or device 905 may be referred to as a host. In some examples, system memory controller 915 or 960 is a GPU.

Encoder 965 may represent a device or signal external to device 905 that provides performs error correction encoding on data to be stored to device 905 or its components. Encoder 965 may write the encoded data to the at least one selected memory via the at least one channel and may also encode data via error correction coding.

Decoder 970 may represent a device or signal external to device 905 that sequences command signals and addressing signals to device 905 or its components. In some examples, memory controller 915 or 960 may be co-located within decoder 970.

Multiplexer 975 may represent a device or signal external to device 905 that multiplexes data to device 905 or its components. Multiplexer 975 may multiplex the data to be transmitted to the encoder 965 and de-multiplex data received from the encoder 965. A multiplexer 975 may be in electronic communication with the decoder 970. In some examples, multiplexer 975 may be in electronic communication with a controller, such as system memory controller 915 or 960.

The components of device 905 may include circuitry designed to carry out their functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or aspect of such a device. In some examples, device 905 is an aspect of a computer with high reliability, mission critical, or low latency constraints or parameters, such as a vehicle (e.g., an autonomous automobile, airplane, a spacecraft, or the like). Device 905 may be or include logic for artificial intelligence (AI), augmented reality (AR), or virtual reality (VR) applications.

In one example, a memory device may include an array of memory cells with a plurality of regions that may each may include a plurality of banks of memory cells, and a plurality of channels traversing the array of memory cells. Each of the channels may be coupled with a region of the array of memory cells and may be configured to communicate signals between the plurality of banks of memory cells in the region with a host device.

In some examples, the memory device may further include I/O areas extending across the array of memory cells, the I/O areas occupying an area of the array of memory cells that may be devoid of memory cells. In some examples of the memory device, the I/O areas may include TSVs configured to couple the array of memory cells with a power node or a ground node.

In some examples, the memory device may further include a plurality of channel interfaces distributed in the array of memory cells. In some examples of the memory device, the plurality of channel interfaces may be bump-outs. In some examples of the memory device, a channel interface of the plurality of channel interfaces may be positioned in each quadrant of the array of memory cells.

In some examples, the memory device may further include a plurality of signal paths extending between memory cells of the region and a channel interface associated with the region. In some examples of the memory device, the channel interface may be positioned in the array of memory cells to minimize a length of the signal paths.

In some examples, the memory device may further include a second array of memory cells stacked on top of the array of memory cells. In some examples of the memory device, the second array of memory cells may have regions that may each include a plurality of banks of memory cells. In some examples, the memory device may further include a second plurality of channels traversing the second array of memory cells. In some examples of the memory device, each of the channels of the second plurality of channels may be coupled with a second region of the second array of memory cells and may be configured to communicate signals between the plurality of banks of memory cells in the second region with the host device.

In some examples, the memory device may further include TSVs extending through the array of memory cells to couple the second array of memory cells with the second plurality of channels. In some examples of the memory device, a channel may establish a point-to-point connection between the region and the host device. In some examples of the memory device, each channel may include four or eight data pins. In some examples of the memory device, the region of the array of memory cells may include eight or more banks of memory cells.

In some examples, the memory device may further include an interface configured for bidirectional communication with the host device. In some examples of the memory device, the interface may be configured to communicate signals modulated using at least one of a NRZ modulation scheme or a PAM4 scheme, or both.

In one example, a memory device may include an array of memory cells with regions that each include a plurality of banks of memory cells, I/O areas extending across the array of memory cells, the I/O areas may include a plurality of terminals configured to route signals to and from the array of memory cells, and a plurality of channels positioned in the I/O areas of the array of memory cells, each of the channels may be coupled with a region of the array of memory cells and may be configured to communicate signals between the plurality of banks of memory cells in the region with a host device.

In some examples, the memory device may further include a plurality of channel interfaces positioned in the I/O areas of the array of memory cells, signal paths couple the regions with the plurality of channel interfaces. In some examples of the memory device, the I/O areas may include TSVs configured to couple a second array of memory cells stacked on top of the array of memory cells with a channel interface.

In some examples of the memory device, a channel interface of the region may be positioned within an I/O area that bisects the region serviced by the channel interface. In some examples of the memory device, the I/O areas may include TSVs configured to couple the array of memory cells with a power node or a ground node. In some examples of the memory device, the I/O areas may occupy an area of the array of memory cells that may be devoid of memory cells. In some examples of the memory device, the array of memory cells may be bisected by two I/O areas. In some examples of the memory device, the array of memory cells may be bisected by four I/O areas.

In one example, a system may include a host device, a memory device including a memory die with a plurality of regions that may each include a plurality of banks of memory cells, and a plurality of channels configured to communicatively couple the host device and the memory device, each of the channels may be coupled with a region of the memory die and may be configured to communicate signals between the plurality of banks of memory cells in the region with the host device.

In some examples, the system may include an interface configured for bidirectional communication with the host device. In some examples of the system, the interface may be configured to communicate signals modulated using at least one of a NRZ modulation scheme or a PAM4 scheme, or both. In some examples of the system, the host device may be an example of a GPU. In some examples of the system, the memory device may be positioned in a same package as the host device.

In one example, a memory device may include an array of memory cells with a plurality of regions that each include a plurality of banks of memory cells, and a plurality of channels traversing the array of memory cells, each of the channels may be coupled to at least one region of the array of memory cells and each channel may include two or more data pins and one or more command/address pin.

In some examples of the memory device, each channel may include two data pins. In some examples of the memory device, each channel may include one command/address pin. In some examples of the memory device, each region of the array may include four banks of memory cells. In some examples of the memory device, each channel may include four data pins. In some examples of the memory device, each channel may include two command/address pins. In some examples of the memory device, each region of the array may include eight banks of memory cells. In some examples of the memory device, each bank of memory cells may be contiguous with a channel.

In some examples of the memory device, a first set of banks of each plurality may be contiguous with a channel and a second set of banks of each plurality may be contiguous with another bank and non-contiguous with a channel. In some examples, the memory device may include 128 data pins and configured with a ratio of two, four, or eight data pins per channel.

In some examples, the memory device may include one, two, three, four, or six command/address pins per channel. In some examples, the memory device may include 256 data pins and configured with a ratio of two, four, or eight data pins per channel. In some examples, the memory device may include one, two, three, four, or six command/address pins per channel. In some examples of the memory device, the array may include a plurality of memory dice that each may include a plurality of channels.

In some examples of the memory device, each memory die of the plurality may be coupled with a different channel of the plurality of channels. In some examples, the memory device may include a buffer layer coupled with array. In some examples, the memory device may include an organic substrate underlying the array.

In some examples of the memory device, the array may be configured for a pin rate of 10, 16, 20, or 24 Gbps. In some examples, the memory device may include an interface configured for bidirectional communication with a host device. In some examples of the memory device, the interface may be configured for at least one of a binary modulation signaling or pulse-amplitude modulation, or both.

In one example, a system may include at least one memory die that may include a plurality of regions that each may include a plurality of banks of memory cells, one or more channels associated with each memory die, each of the channels may be coupled to at least one region of the die of memory cells and each channel may include two or more data pins, and an organic substrate that underlies the memory die.

In some examples, the system may include a host device, and an interface configured for bidirectional communication with the host device, the interface supports at least one of a NRZ signaling or a PAM4, or both. In some examples of the system, the host device may include a GPU.

In some examples, the system may include a plurality of memory arrays that each may include 128 or 256 data pins and configured with a ratio of two, four, or eight data pins per channel. In some examples, the system may include a buffer layer positioned between the at least one memory die and the organic substrate.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As may be used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The may be used herein, the term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of a memory array.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. In some examples, the substrate may be an organic build up substrate formed from materials such as ABF or BT. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
a plurality of stacked layers each comprising a respective memory die;
an array of memory cells in a memory die of a layer of the plurality of stacked layers, the array of memory cells with a plurality of regions that each comprise a plurality of banks of memory cells, wherein a first region of the plurality of regions comprises a first set of banks and a second set of banks;
an input/output (I/O) area of the array that divides the first region, wherein the first set of banks is positioned on a first side of the I/O area and wherein the second set of banks is positioned on a second side of the I/O area; and
a plurality of channels traversing the array of memory cells, the plurality of channels comprising a set of channels that is in the I/O area and that includes at least one channel comprising a set of pins of a plurality of sets of pins, each pin of the set of pins is directly coupled with both the first set of banks positioned on the first side of the I/O area and the second set of banks that is positioned on the second side of the I/O area, wherein each set of pins of the plurality of sets of pins is associated with a separate layer of the plurality of stacked layers, and wherein the set of channels is configured to communicate signals between the first region and a host device.

2. The memory device of claim 1, wherein the I/O area occupies an area of the array that is devoid of memory cells.

3. The memory device of claim 2, wherein the I/O area includes a through-silicon via (TSV) configured to couple the array of memory cells with a power node or a ground node.

4. The memory device of claim 1, further comprising:
a plurality of channel interfaces distributed in the array of memory cells.

5. The memory device of claim 4, wherein the plurality of channel interfaces comprise bump-out terminals.

6. The memory device of claim 5, wherein a channel interface of the plurality of channel interfaces is positioned in each quadrant of the array of memory cells.

7. The memory device of claim 4, further comprising:
a plurality of signal paths extending between memory cells of the first region and a channel interface associated with the first region, wherein the channel interface is positioned in the array of memory cells such that the channel interface minimizes a length of the plurality of signal paths.

8. The memory device of claim 1, further comprising:
a second array of memory cells in a second layer of the plurality of stacked layers, the second array of memory cells having a plurality of second regions that each comprise a second plurality of banks of memory cells; and
a second plurality of channels traversing the second array of memory cells, wherein each channel of the second plurality of channels is coupled with a second region of the plurality of second regions of the second array of memory cells and is configured to communicate signals between the second plurality of banks of memory cells in the second region with the host device.

9. The memory device of claim 1, wherein each set of pins comprises at least one data pin and at least one command/address pin.

10. The memory device of claim 9, wherein at least one pin of the host device is coupled with corresponding pins of the array and a second array.

11. A memory device, comprising:
a plurality of stacked layers each comprising a respective memory die;
a memory die, of a layer of the plurality of stacked layers, comprising an array of memory cells with a plurality of regions that each comprise a plurality of banks of memory cells, wherein a first region of the plurality of regions comprises a first set of banks and a second set of banks;

input/output (I/O) areas extending across the array of memory cells, the I/O areas comprising a first I/O area that divides the first region and that is between the first set of banks and the second set of banks; and a plurality of channels positioned in the I/O areas of the array of memory cells, the plurality of channels comprising a set of channels that is in the first I/O area and that includes at least one channel comprising a set of pins of a plurality of sets of pins, each pin of the set of pins is directly coupled with both the first set of banks and the second set of banks in the first region divided by the first I/O area, wherein each set of pins of the plurality of sets of pins is associated with a separate layer of the plurality of stacked layers, and wherein the set of channels is configured to communicate signals between the first region and a host device.

12. The memory device of claim 11, further comprising:
a plurality of channel interfaces positioned in the I/O areas of the array of memory cells, wherein signal paths couple the plurality of regions with the plurality of channel interfaces.

13. The memory device of claim 12, wherein the I/O areas include through-silicon vias (TSVs) configured to couple a second array of memory cells stacked above the array of memory cells with a channel interface.

14. The memory device of claim 12, wherein a channel interface of the first region is positioned within the I/O area, and wherein the I/O area bisects the first region serviced by the channel interface.

15. The memory device of claim 11, wherein the I/O areas include through-silicon vias (TSVs) configured to couple the array of memory cells with a power node or a ground node.

16. The memory device of claim 11, wherein the I/O areas occupy an area of the array of memory cells that is devoid of memory cells.

17. The memory device of claim 11, wherein the array of memory cells is bisected by two I/O areas or four I/O areas.

18. A system, comprising:
a host device;
a memory device comprising a plurality of stacked layers each comprising a respective memory die;
a memory die, of a layer of the plurality of stacked layers, with a plurality of regions that each comprise a plurality of banks of memory cells, wherein a first region of the plurality of regions comprises a first set of banks and a second set of banks;
an input/output (I/O) area of the memory die that divides the first region and that is between the first set of banks and the second set of banks; and
a plurality of channels configured to communicatively couple the host device and the memory device, the plurality of channels comprising a set of channels that is in the I/O area and that includes at least one channel comprising a set of pins of a plurality of sets of pins, each pin of the set of pins is directly coupled with both the first set of banks and the second set of banks in the first region divided by the I/O area, wherein each set of pins of the plurality of sets of pins is associated with a separate layer of the plurality of stacked layers, and wherein the set of channels is configured to communicate signals between the first region and the host device.

19. The system of claim 18, further comprising:
an interface configured for bidirectional communication with the host device, wherein the interface is configured to communicate signals modulated using at least one of non-return to zero (NRZ) modulation scheme or a four-symbol pulse-amplitude modulation (PAM4) scheme, or both.

20. The system of claim 18, wherein the host device comprises a graphics processing unit (GPU), and wherein the memory device is positioned in a same package as the host device.

* * * * *